(12) United States Patent
Chang et al.

(10) Patent No.: US 11,844,209 B2
(45) Date of Patent: Dec. 12, 2023

(54) MEMORY CELL AND METHOD OF FORMING THE MEMORY CELL

(71) Applicant: TAIWAN SEMICONDUCTOR MANUFACTURING COMPANY LTD., Hsinchu (TW)

(72) Inventors: Meng-Sheng Chang, Hsinchu County (TW); Chia-En Huang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 690 days.

(21) Appl. No.: 16/842,693

(22) Filed: Apr. 7, 2020

(65) Prior Publication Data

US 2021/0313337 A1    Oct. 7, 2021

(51) Int. Cl.
| | |
|---|---|
| *H10B 20/20* | (2023.01) |
| *G11C 7/18* | (2006.01) |
| *H01L 23/525* | (2006.01) |
| *H01L 23/522* | (2006.01) |
| *H01L 23/528* | (2006.01) |
| *G11C 8/14* | (2006.01) |

(52) U.S. Cl.
CPC .............. *H10B 20/20* (2023.02); *G11C 7/18* (2013.01); *G11C 8/14* (2013.01); *H01L 23/5226* (2013.01); *H01L 23/5252* (2013.01); *H01L 23/5283* (2013.01)

(58) Field of Classification Search
CPC ............. H01L 23/5226; H01L 23/5252; H01L 23/5283; H01L 27/11206; G11C 8/14; G11C 7/18

See application file for complete search history.

(56) References Cited

U.S. PATENT DOCUMENTS

| | | | |
|---|---|---|---|
| 2005/0179078 A1* | 8/2005 | Lee | H01L 27/11546 438/257 |
| 2015/0016173 A1* | 1/2015 | Liaw | G11C 5/063 365/72 |

* cited by examiner

*Primary Examiner* — Brook Kebede
(74) *Attorney, Agent, or Firm* — WPAT LAW; Anthony King (57) ABSTRACT

A memory cell includes: a first transistor, having a first diffusion region coupled to a bit line and a first gate electrode coupled to a first word line; a second transistor, having a second diffusion region coupled to the bit line and a second gate electrode coupled to a second word line; and a third transistor, having a third diffusion region coupled to a fourth diffusion region of the first transistor, a fifth diffusion region coupled to a sixth diffusion region of the second transistor, and a third gate electrode coupled to a third word line; wherein the first transistor is arranged to have a first threshold voltage, the second transistor is arranged to have a second threshold voltage, and the second threshold voltage is different from the first threshold voltage.

20 Claims, 7 Drawing Sheets

MEMORY CELL AND METHOD OF FORMING THE MEMORY CELL

BACKGROUND

A nonvolatile semiconductor memory device is typically designed to store data even when power is off from the memory device. One type of the nonvolatile semiconductor memory device is one time programmable memory device. Current approaches usually use poly or metal fuses to form a one time programming memory cell. In many situations, however, both poly and metal fuses require a large program current to produce the high post-program resistance. As a result, the memory cells are large because they include large transistors or devices to handle the large program current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1:
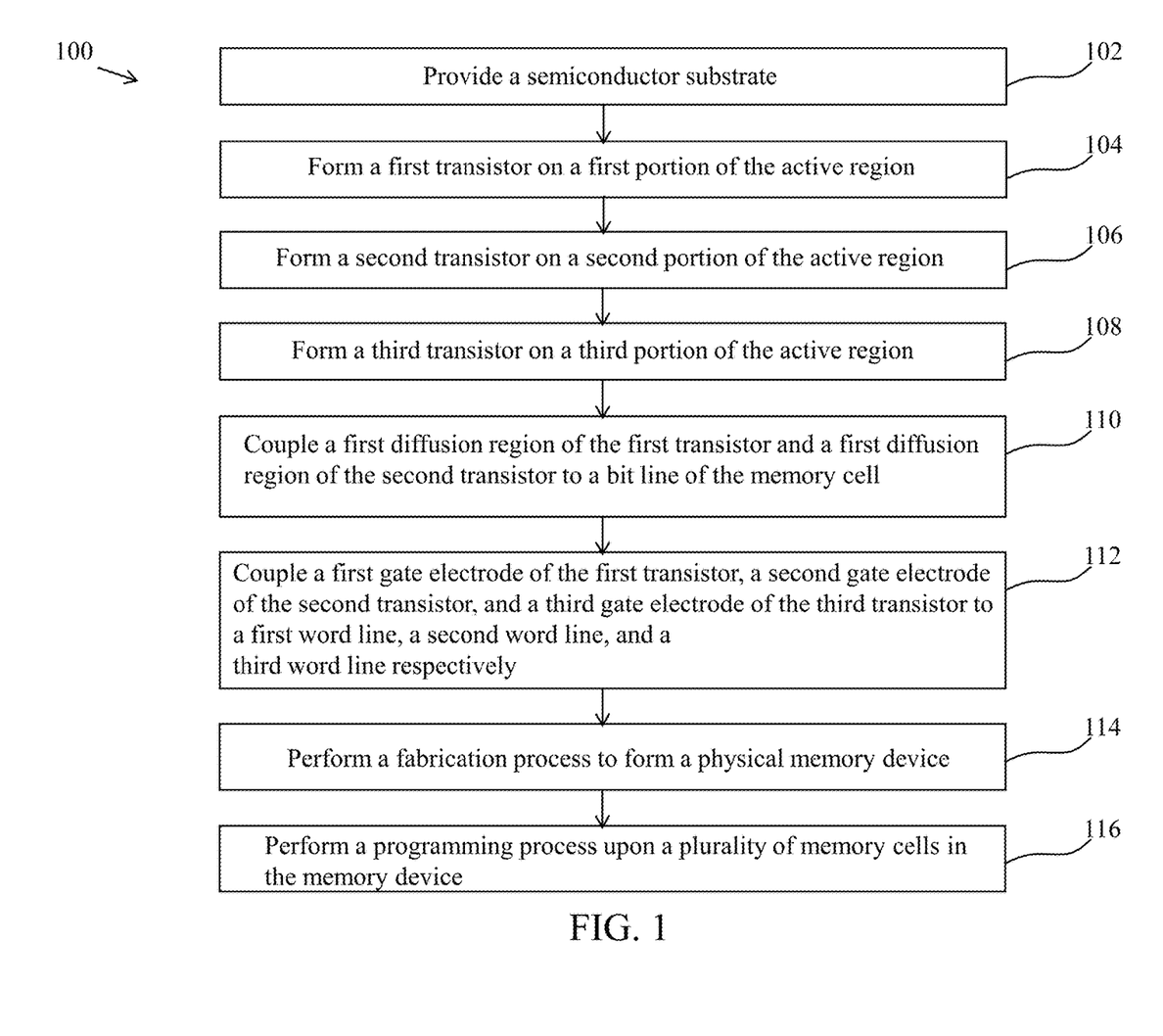
FIG. 1 is a flowchart illustrating a method for forming a memory device according to some embodiments.

FIG. 1 is a flowchart illustrating a method 100 for forming a memory device according to some embodiments. The memory device is a non-volatile memory device arranged to store data through a programming process. The method 100 is executable by a processor and/or a chip fabricator. Some of the operations in the method 100 may by manually executed. Some operations in the method 100 may be compiled in a computer readable program. The computer readable program may be stored in a storage device. The processor may read or reload the computer readable program from the storage device to execute some operations in the method 100 upon the layout structure of the memory device. The memory device is composed of a plurality of memory cells. The layout of the memory cell may be pre-designed and stored in cell libraries. Generally speaking, the method 100 is designed to form the memory device with relatively stable program currents and read currents upon the memory cells when the memory cells are programmed to be the anti-fuses.

According to some embodiments, the method 100 comprises operations 102-116. Provided that substantially the same result is achieved, the operations of the flowchart shown in FIG. 1 may not follow the same order and may not be contiguous. In some embodiments, other intermediate operations may be included.

In operation 102, a semiconductor substrate is provided to form an active device. The active device is formed on an active region on the semiconductor substrate. The active device may be a memory cell. For the memory cell, the active region may be divided into three portions, in which one portion may be arranged to form a transistor. The transistor may be a metal-oxide-semiconductor field effected transistor (MOSFET). The transistor may comprises four terminals a first diffusion region (e.g. drain terminal), a second diffusion region (e.g. source terminal), a gate electrode (e.g. gate terminal), and a body (e.g. semiconductor substrate).

In operation 104, a first transistor with a first threshold voltage is formed on the first portion of the active region.

In operation 106, a second transistor with a second threshold voltage is formed on the second portion of the active region. The second threshold voltage is different from the first threshold voltage. According to some embodiments, the second threshold voltage is lower than the first threshold voltage.

In operation 108, a third transistor is formed on the third portion of the active region. According to some embodiment, the threshold voltage of the third transistor may be similar to the first threshold voltage.

In operation 110, a first diffusion region of the first transistor and a first diffusion region of the second transistor are coupled to a bit line of the memory cell.

In operation 112, a first gate electrode of the first transistor, a second gate electrode of the second transistor, and a third gate electrode of the third transistor are coupled to a first word line, a second word line, and a third word line of the memory cell respectively.

In operations 102-112, a layout of the memory device having a memory cell is formed on the semiconductor substrate. The memory cell may be a fusible memory cell. According to some embodiments, the memory cell comprises three transistors (3T or 1P2R), in which one transistor may be a programmable transistor, and the other two transistors may be readout transistors.

In operation 114, a fabrication process is performed upon the layout to form a physical memory device. The fabrication process may comprise a mask fabrication process for fabricating the masks corresponding to the layout. The fabrication process may be carried out by a semiconductor fabricator based on a graphic database system ("GDS") II file of the memory device.

In operation 116, a programming process is performed upon a plurality of memory cells of the memory device based on the data to be stored into the memory device. The programming process may be carried out by a programming machine capable of generating a normal voltage level (e.g. 1.8 V) and a relatively high voltage level (e.g. 5 V). During the programming process, a memory cell is programmed to be an anti-fuse when the memory cell is arranged to store a first bit value (e.g. bit "1") of the data, and a memory cell is programmed to be a fuse cell when the memory cell is arranged to store a second bit value (e.g. bit "0") of the data. It is noted that this is not the limitation of the present embodiment. In another embodiment, a memory cell may be programmed to be a fuse cell when the memory cell is arranged to store the bit "1" of the data, and a memory cell may be programmed to be an anti-fuse when the memory cell is arranged to store the bit "0" of the data.

Figure 2:
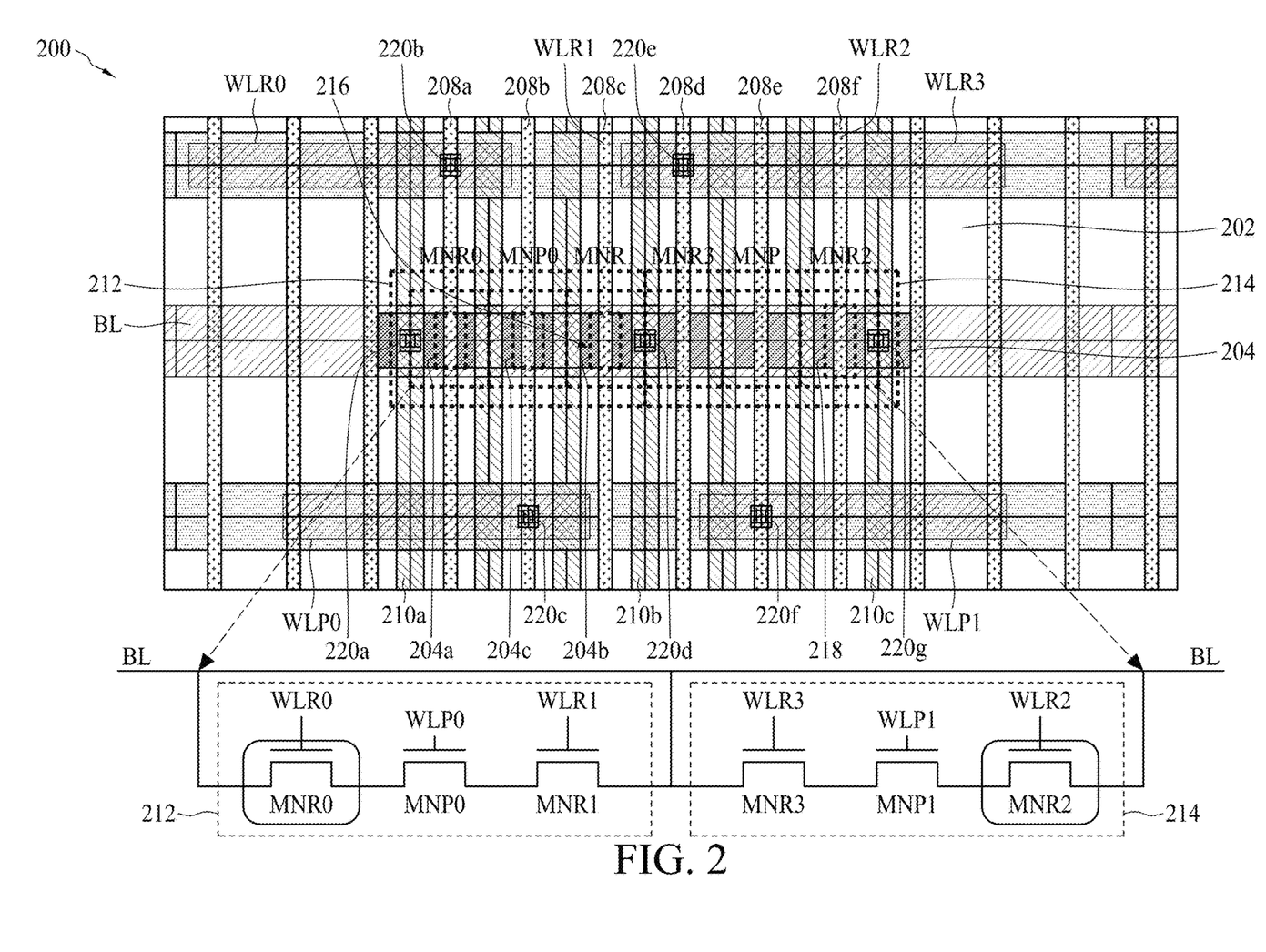
FIG. 2 is a diagram illustrating a layout of a memory device in accordance with some embodiments.

Please refer to operations 102-112 of the method 100 again. FIG. 2 is a diagram illustrating a layout 200 of the memory device in accordance with some embodiments. According to some embodiments, the layout 200 comprises a semiconductor substrate 202, an active region 204, a plurality of conductive lines 208a-208f, and a plurality of conductive lines 210a-210c. According to some embodiments, the plurality of conductive lines 208a-208f are a plurality of polysilicon lines respectively, and the plurality of conductive lines 210a-210c are a plurality of metal lines respectively. For description purpose, in the following paragraphs, the plurality of conductive lines 208a-208f are also named as the plurality of polysilicon lines 208a-208f respectively, and the plurality of conductive lines 210a-210c are also named as the plurality of metal lines 210a-210c respectively.

In FIG. 2, the active region 204 is horizontally (for example) disposed on the semiconductor substrate 202. The polysilicon lines 208a-208f are vertically (for example) disposed over a plurality of portions (e.g. 204a, 204b, 204c) of the active region 204. The metal lines 210a-210c are vertically disposed over the diffusion regions of the active region 204. More specifically, the metal line 210a is disposed on the left side of the polysilicon line 208a, the metal line 210b is disposed between the polysilicon line 208c and the polysilicon line 208d, and the metal line 210c is disposed on the right side of the polysilicon line 208f.

According to some embodiments, the metal lines 210a-210c are coupled to the bit line BL of the memory device. The polysilicon lines 208a-208f are coupled to a plurality of word lines WLR0, WLP0, WLR1, WLR3, WLP1, and WLR2 of the memory device respectively.

In addition, the layout 200 further comprises a plurality of via structures 220a-220g. The via structure 220a is arranged to couple between a portion of the active region 204 (i.e. the diffusion region on the left side of the polysilicon line 208a) and the metal line 210a, in which the metal line 210a is coupled to the bit line BL. The via structure 220b is arranged to couple between the polysilicon line 208a and the metal line connected to the word line WLR0. The via structure 220c is arranged to couple between the polysilicon line 208b and the metal line connected the word line WLP0. The via structure 220d is arranged to couple between a portion of the active region 204 (i.e. the diffusion region on the right side of the polysilicon line 208d) and the metal line 210b, in which the metal line 210b is coupled to the bit line BL. The via structure 220e is arranged to couple between the polysilicon line 208d and the metal line connected to the word line WLR3. The via structure 220f is arranged to couple between the polysilicon line 208e and the metal line connected to the word line WLP1. The via structure 220g is arranged to couple between a portion of the active region 204 (i.e. the diffusion region on the right side of the polysilicon line 208f) and the metal line 210c, in which the metal line 210c is coupled to the bit line BL.

Please refer to FIG. 2 again, taking the metal line 210b as the central line of the active region 204, a first memory cell 212 of the memory device is formed on a left portion of the active region 204 (i.e. the left side of the metal line 210b), and a second memory cell 214 of the memory device is formed on a right portion of the active region 204 (i.e. the right side of the metal line 210b). According to some embodiments, the memory cell 212 comprises a first reading field-effect transistor (FET) MNR0, a programming FET MNP0, and a second reading FET MNR1. The memory cell 214 comprises a first reading FET MNR2, a programming FET MNP1, and a second reading FET MNR3. Although the layout structure 200 of the memory device merely comprises two memory cells (i.e. 212 and 214), the present invention is not limited by this embodiment.

For illustrative purpose, the schematic of the memory cells 212 and 214 are also shown in FIG. 2. According to some embodiments, a first connecting terminal (e.g. source) of the FET MNR0 is coupled to the bit line BL, a control terminal (e.g. gate) of the FET MNR0 is coupled to the word line WLR0, and a second connecting terminal (e.g. drain) of the FET MNR0 is coupled to a first connecting terminal of the FET MNP0. A control terminal of the FET MNP0 is coupled to the word line WLP0, and a second connecting terminal of the FET MNP0 is coupled to a first terminal of the FET MNR1. A control terminal of the FET MNR1 is coupled to the word line WLR1. A second connecting terminal of the MNR1 is coupled to a first connecting terminal of the FET MNR3 and the bit line BL. A control terminal of the FET MNR3 is coupled to the word line WLR3, and a second connecting terminal of the FET MNR3 is coupled to a first connecting terminal of the FET MNP1. A control terminal of the FET MNP1 is coupled to the word line WLP1, and a second connecting terminal of the FET MNP1 is coupled to a first connecting terminal of the FET MNR2. A control terminal of the FET MNR2 is coupled to the word line WLR2, and a second connecting terminal of the FET MNR2 is coupled to the bit line BL. The first memory cell 212 and the second memory cell 214 are double word line controlled memory. For example, the first memory cell 212 is controlled by the word lines WLR0 and WLR1.

In addition, for each memory cell (e.g. 212) of the memory device, the electrical characteristic of the first reading FET (e.g. MNR0) is different from the electrical characteristic of the second reading FET (e.g. MNR1). The electrical characteristic may be the threshold voltage of a transistor. More specifically, for each memory cell (e.g. 212) of the memory device, the threshold voltage of the first reading FET (e.g. MNR0) is different from the threshold voltage of the second reading FET (e.g. MNR1). For example, the threshold voltage of the first reading FET MNR0 is a normal or standard threshold voltage, and the threshold voltage of the second reading FET MNR1 is designed to be lower than the normal threshold voltage. However, this is not a limitation of the embodiment. In another embodiment, the threshold voltage of the second reading FET MNR1 may be the normal threshold voltage, and the threshold voltage of the first reading FET MNR0 is designed to be higher than the normal threshold voltage.

To make the threshold voltage of the second reading FET MNR1 to lower than the threshold voltage of the first reading FET MNR0, in one embodiment, the dopant concentration (e.g. the concentration of n-type dopants) on the channel region of the second reading FET MNR1 is greater than the dopant concentration (e.g. the concentration of n-type dopants) on the channel region of the first reading FET MNR0. In another embodiment, the thickness of gate dielectric layer of the second reading FET MNR1 is smaller than the thickness of gate dielectric layer of the first reading FET MNR0. It is noted that the present invention is not limited by the above mentioned embodiments. Moreover, the gate dielectric may be a silicon dioxide layer or a high permittivity (high-k) dielectric layer. According to some embodiments, the high-k material may be oxide of tantalum (e.g. $Ta_2O_5$), oxide of zirconium ($ZrO_2$), oxide of aluminum, or oxide of silicon (e.g. $SiO_2$), or $Al_3N_4$, for example. The gate dielectric may be formed or deposited by a process of chemical vapor deposition (CVD).

According to some embodiments, during the operations 102-112 in the method 100, a specific computer aided design (CAD) layer 216 (and 218) may be disposed over the channel region of the second reading FET MNR1, in which the specific CAD layer 216 may cause the dopant concentration on the channel region of the second reading FET MNR1 to be greater than the dopant concentration on the channel region of the first reading FET MNR0 or cause the thickness of gate dielectric layer of the second reading FET MNR1 to be smaller than the thickness of gate dielectric layer of the first reading FET MNR0 during the fabrication process. According to some embodiments, the specific CAD layer 216 may comprise more than one CAD layer, in which one CAD layer represents one mask structure is used during the fabrication step. Therefore, the specific CAD layer 216 may represent the number of mask structures used in the fabrication step of the memory cell. For example, the more mask structures used in the fabrication step, the higher dopant concentration formed on the channel region of the second reading FET MNR1. For another example, the more mask structures used in the fabrication step, the smaller thickness of gate dielectric layer formed on the channel region of the second reading FET MNR1.

Figure 3A:
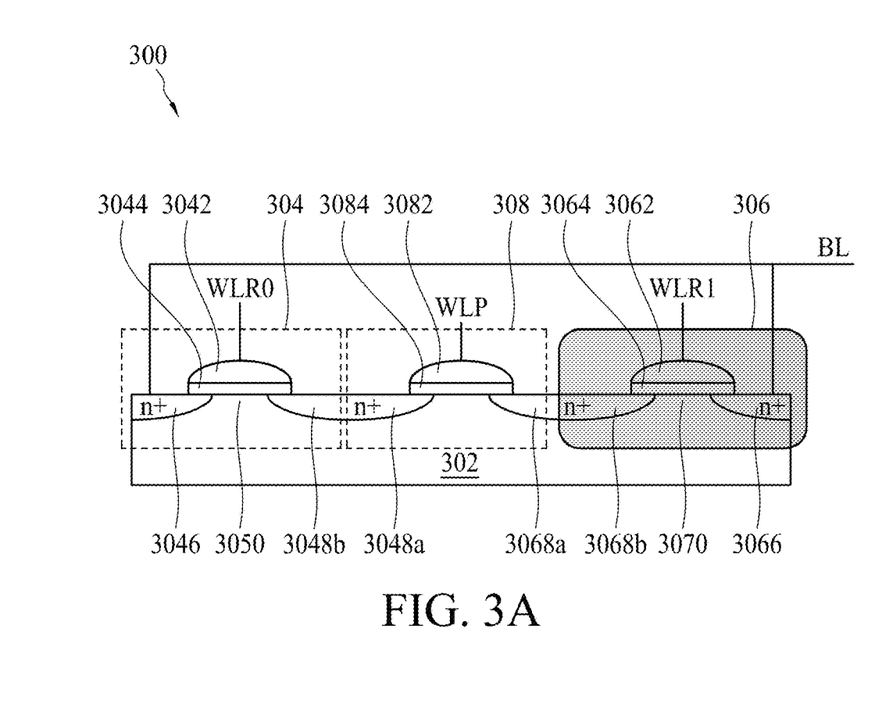
FIG. 3A is a cross-sectional diagram illustrating a memory cell 300 after a fabrication process in accordance with some embodiments.
Figure 3B:
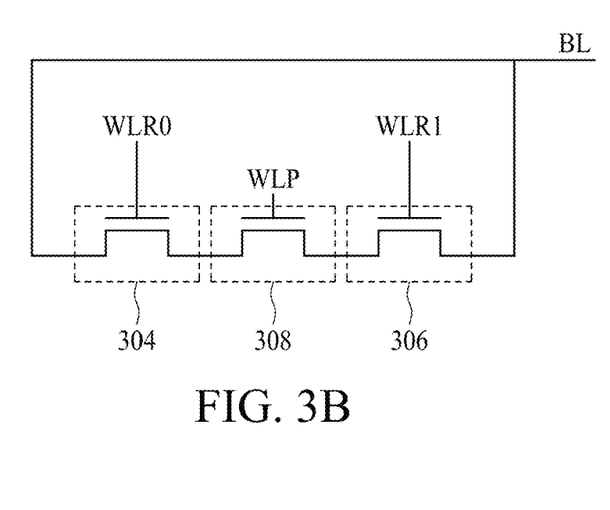
FIG. 3B is a schematic diagram illustrating a memory cell accordance with some embodiments.

Please refer to operation 114 of the method 100 again. FIG. 3A is a cross-sectional diagram illustrating a memory cell 300 after the fabrication process in accordance with some embodiments. FIG. 3B is a schematic diagram illustrating the memory cell 300 accordance with some embodiments. The memory cell 300 comprises a semiconductor substrate 302, a first FET 304, a second FET 306, and a third FET 308. The FETs 304, 306, and 308 are formed on the semiconductor substrate 302. According to some embodiments, the FETs 304, 306, and 308 are n-type metal-oxide-semiconductor field-effect transistor (n-type MOSFET). However, this is not a limitation of the present embodiment. The FETs 304, 306, and 308 may be implemented with p-type MOSFET. For brevity, the memory cell 300 may be the fabricated memory cell 212. Therefore, the FETs 304, 306, and 308 may correspond to the first reading FET MNR0, the second reading FET MNR1, and the programming FET MNP0 respectively.

In this embodiment, the FET 304 comprises a gate electrode 3042, a gate dielectric layer 3044, a first diffusion layer 3046, and a first portion of a second diffusion layer 3048b. The FET 306 comprises a gate electrode 3062, a gate dielectric layer 3064, a first diffusion layer 3066, and a first portion of a second diffusion layer 3068b. The FET 308 comprises a gate electrode 3082, a gate dielectric layer 3084, a second portion of the second diffusion layer 3048a, and a second portion of the second diffusion layer 3068a. In other words, the FETs 304 and 308 share the second diffusion layer (3048a and 3048b), and the FETs 306 and 308 share the second diffusion layer (3068a and 3068b). In addition, the gate electrode 3042 is coupled to a first word line WLR0, the gate electrode 3062 is coupled to a second word line WLR1, and the gate electrode 3082 is coupled to a third word line WLP. The diffusion layers 3046 and 3066 are coupled to a bit line BL. According to some embodiments, the diffusion layers 3046, 3066, 3048a, 3048b, 3068a, and 3068b are doped with n-type dopants (i.e. n+).

The memory cell 300 may be arranged to form a non-volatile memory cell. The non-volatile memory cell may be a fusible circuit. A fusible circuit is achieved by using a fuse transistor as a normal transistor in a non-conductive state as a high impedance state for an un-programmed condition and using an anti-fuse transistor that has had its gate dielectric forced into a conductive condition as a low impedance as the programmed state. This programmed state is achieved by applying a relatively high voltage (e.g. 5 V) to the gate of the fuse transistor to cause the fuse transistor to be programmed and thus to be permanently conductive (i.e. the anti-fuse transistor). The anti-fuse transistor is held in a conductive condition to provide the programmed state. The fuse transistor is held in a non-conductive condition to provide the un-programmed state. A circuit coupled to the fusible circuit generates a signal to indicate the state of the fusible circuit. This signal can then be used to implement a function in a memory.

As mentioned in the operations 102-112, the channel region of the FET 306 is disposed with the specific CAD layer 216 while the channel region of the FET 304 is not disposed with the specific CAD layer 216 during the layout design stage, thus the threshold voltage of the FET 306 is lower than the threshold voltage of the FET 304.

More specifically, in one embodiment, the layer thickness of the gate dielectric layer 3064 of the FET 306 is smaller than the layer thickness of the gate dielectric layer 3044 of the FET 304. The layer thickness of the gate dielectric layer 3084 of the FET 308 may be similar to the layer thickness of the gate dielectric layer 3044 of the FET 304. It is noted that the layer thickness of a gate dielectric layer is a distance measured from the top surface of the channel region to the bottom surface of the gate electrode of an FET.

In another embodiment, the dopant concentration of the channel region 3070 of the FET 306 is greater than the dopant concentration of the channel region 3050 of the FET 304. The dopant concentration of the channel region of the FET 308 may be similar to the dopant concentration of the channel region 3050 of the FET 304. It is noted that the channel region of an FET may be the region located between a first diffusion region (e.g. drain) and a second diffusion region (e.g. source) of the FET.

When the threshold voltage of the FET 306 is lower than the threshold voltage of the FET 304, the channel resistance (i.e. the resistance between the source and the drain of a transistor) of the FET 306 may be smaller than the channel resistance of the FET 304 when the voltage level of the first word line WLR0 (i.e. the gate electrode 3042) is similar to the voltage level of the second word line WLR1 (i.e. the gate electrode 3062). Moreover, the saturation current of the FET 306 may be greater than the saturation current of the FET 304. Accordingly, when the threshold voltage of the FET 306 is lower than the threshold voltage of the FET 304, the current flowing to the bit line BL from the third word line WLP through the FET 306 may be greater than the current flowing to the bit line BL from the third word line WLP through the FET 304 when the FET 308 is programmed to be an anti-fuse transistor.

Figure 4:
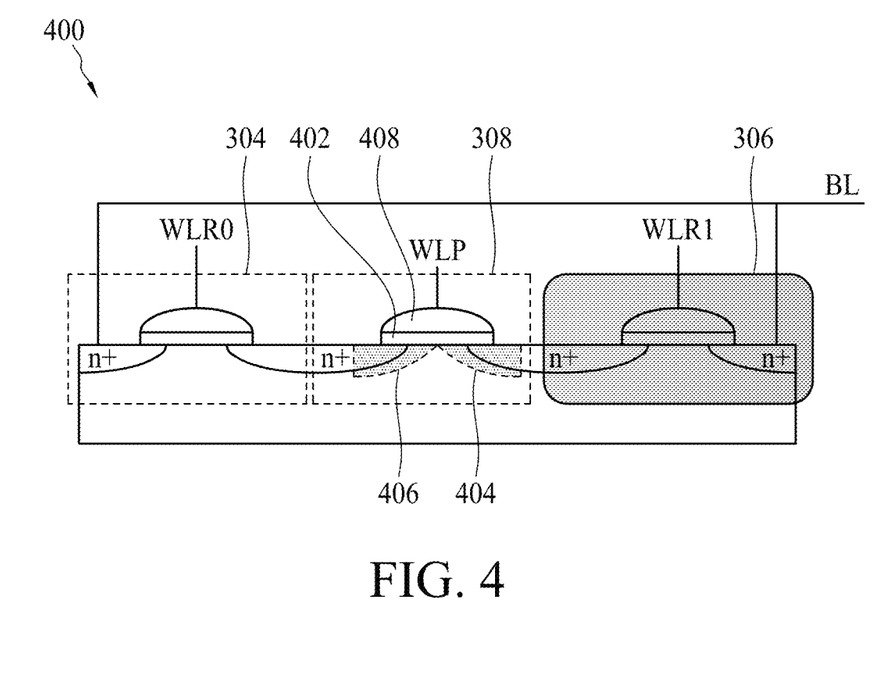
FIG. 4 is a cross-sectional diagram illustrating a memory cell during a programming process in accordance with some embodiments.

Please refer to operation 116 of the method 100 again. FIG. 4 is a cross-sectional diagram illustrating a memory cell 400 during the programming process in accordance with some embodiments. During the programming process, if the FET 308 is being programmed into an anti-fuse transistor, the FETs 304 and 306 are turned on by the normal voltage levels (e.g. 1.8 V) applied on the word lines WLR0 and WLR1 respectively, and a voltage level (e.g. 5 V) higher than the normal voltage level is applied to the gate (i.e. the word line WLP) of the FET 308 of the memory cell 400. More specifically, during the programming process, the n-type dopants 404 may accumulate in the channel region 406 of the FET 308, and the electric force between the channel region 406 and the gate electrode 408 of the FET 308 may breakdown the gate dielectric layer 402 of the FET 308 such that a conductive path with a resistance is formed between the channel region 406 and the gate electrode 408 of the FET 308. The conductive path may be permanently formed between the channel region 406 and the gate electrode 408 of the FET 308. In other words, a resistor may be permanently formed between the channel region 406 and the gate electrode 408 of the FET 308 when the FET 308 is programmed into an anti-fuse transistor.

Figure 5A:
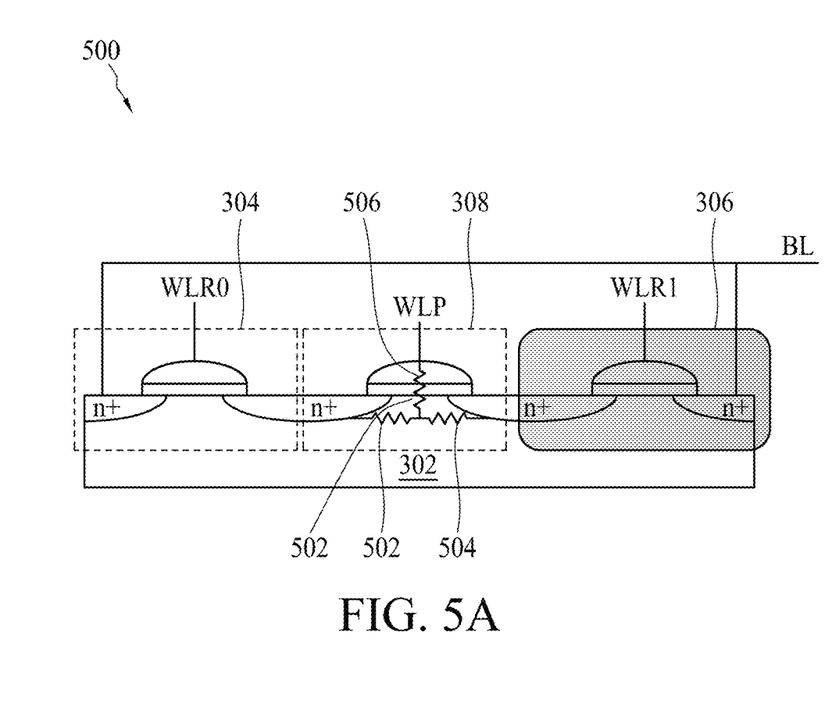
FIG. 5A is a cross-sectional diagram illustrating a memory cell after a programming process in accordance with some embodiments.

FIG. 5A is a cross-sectional diagram illustrating a memory cell 500 after the programming process in accordance with some embodiments. For brevity, the memory cell 500 is the memory cell 400 after programmed into an anti-fuse cell. According to some embodiments, the memory cell 500 may be simplified into an equivalent circuit having three resistors 502, 504, and 506 during the reading operation of the memory cell 500. For illustrative purpose, the FETs 304, 306, and 308 are also shown in FIG. 5A. The resistor 502 with a resistance R1 is an equivalent resistor formed between the channel region 406 of the FET 308 to the bit line BL through the FET 304. The resistor 504 with a resistance R2 is an equivalent resistor formed between the channel region 406 of the FET 308 to the bit line BL through the FET 306. The resistor 506 with a resistance Rox is an equivalent resistor of the conductive path formed between the channel region 406 and the word line WLP. The resistor 502 may be regarded as the channel resistor (i.e. the resistor between the source and the drain of a transistor) of the FET 304 when the FET 304 is turned on. The resistor 504 may be regarded as the channel resistor of the FET 306 when the FET 306 is turned on. As mentioned in above, the resistance R2 is smaller than the resistance R1 as the threshold voltage of the FET 306 is lower than the threshold voltage of the FET 304.

Figure 5B:
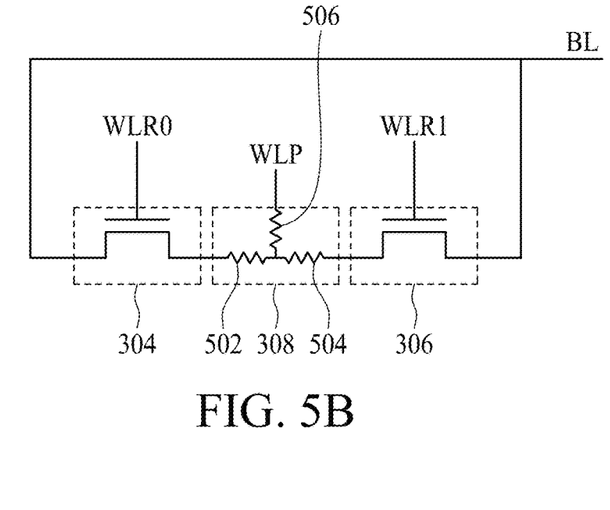
FIG. 5B is a schematic diagram illustrating a simplified circuit of the memory cell accordance with some embodiments.

FIG. 5B is a schematic diagram illustrating the simplified circuit of the memory cell 500 accordance with some embodiments. In FIG. 5B, the FET 304 and the FET 306 may be regarded as two ideal switches as their channel resistors have been represented as the resistors 502 and 504 respectively. More specifically, when the FET 304 and the FET 306 are turned on, a first terminal of the resistor 502 is coupled to the bit line BL, a first terminal of the resistor 504 is coupled to the bit line BL, a first terminal of the resistor 506 is coupled to the word line WLP, and the second terminals of the resistors 502, 504, and 506 are coupled with each other. When the FET 304 is turned on and the FET 306 is turned off, a first resistance Ra (i.e. Rox+R1) may be measured between the bit line BL and the word line WLP. When the FET 304 is turned off and the FET 306 is turned on, a second resistance Rb (i.e. Rox+R2) may be measured between the bit line BL and the word line WLP. According to some embodiments, the second resistance Rb is smaller than the first resistance Ra.

When the memory cell 500 is operated under the reading stage, the FET 304 and the FET 306 are turned on by the voltages applied on the word lines WLR0 and WLR1 respectively, a high voltage level $V_{WLP}$ (e.g. 1.8 V) is applied to the word line WLP, and a low voltage level (e.g. 0 V) is applied to the bit line BL. Accordingly, during the reading stage, and a readout current Id may flow to the bit line BL from the word line WLP, and the readout current Id may be expressed by the following equation (1):

$$Id = V_{WLP}/[(Rox+R1)//(Rox+R2)] \qquad (1)$$

Figure 6:
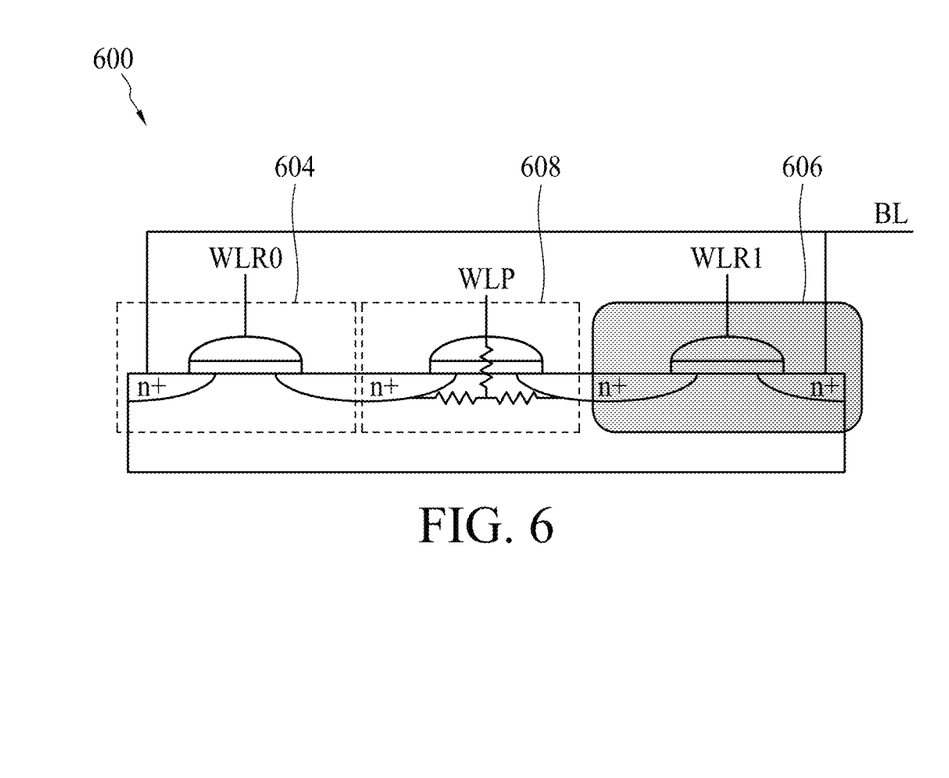
FIG. 6 is a diagram illustrating a counterpart of a memory cell.

The operator "//" in the equation (1) is the parallel operator that represents the reciprocal value of a sum of reciprocal values. When the resistance R2 of the FET 306 is smaller than the resistance R1 of the FET 304, the readout current Id may be increased in comparison to the counterpart in which the channel resistors of the FETs 304 and 306 are R1. FIG. 6 is a diagram illustrating a counterpart 600 of the memory cell 500. In the counterpart 600, the FET 604 is identical to the FET 606. Therefore, the threshold voltage of the FET 604 is similar to the threshold voltage of the FET 606. When the FET 608 is programmed to be an anti-fuse transistor, the FETs 604, 606, and 608 may be simplified into an equivalent circuit having a first resistor 610, a second resistor 612, and a third resistor 614. The connectivity of the resistors 610, 612, and 614 is shown in FIG. 6, and the detailed description is omitted here for brevity. Moreover, the resistances of the resistors 610, 612, and 614 are R1, R1, and Rox respectively. Accordingly, during the reading stage, and a readout current Is may flow to the bit line BL from the word line WLP, and the readout current Is may be expressed by the following equation (2):

$$Is = V_{WLP} / [(Rox+R1)//(Rox+R1)] \quad (2)$$

The operator "//" in the equation (2) is the parallel operator that represents the reciprocal value of a sum of reciprocal values. In comparison to the equations (1) and (2), it is obtained that the readout current Id of the present memory cell 500 is greater than the readout current Is of the counterpart 600. Therefore, the readout current Id of the present memory cell 500 is improved in comparison to the counterpart 600.

One of the features of the present embodiments is to reduce the threshold voltage of one of the reading FETs such that the turn-on current of the reading FETs is increased during the reading operation of the memory cell. Therefore, during the reading operation of the memory cell, a reading circuit (not shown) may easily detect the output current of the memory cell. Moreover, as the current generated by the memory cell is increased, the voltage drop between the memory cell and the reading circuit may not affect the effectiveness of the reading operation.

More specifically, the parasitic resistance of the word lines and/or bit lines of the memory cell may cause voltage drop from the memory cell to the reading circuit and/or controlling circuit of the memory cell. For the existing art (e.g. the memory cell 600), this voltage drop may affect the reading operation of the reading circuit and the programming of the controlling circuit. On the contrary, in the present embodiments, the increased output current of the memory cell may compensate the effect caused by the parasitic resistance of the bit line. Therefore, the present memory device has relatively stable programming and reading operation in comparison to the existing arts.

Briefly, in the present embodiments, for a memory cell comprised of one programmable transistor and two readout transistors (1P2R), the threshold voltage of one of the readout transistors is arranged to be lower than the threshold voltage of the other readout transistor. By doing this, the readout current of the memory cell may be increased when the memory cell is programmed to be an anti-fuse cell.

Figure 7:
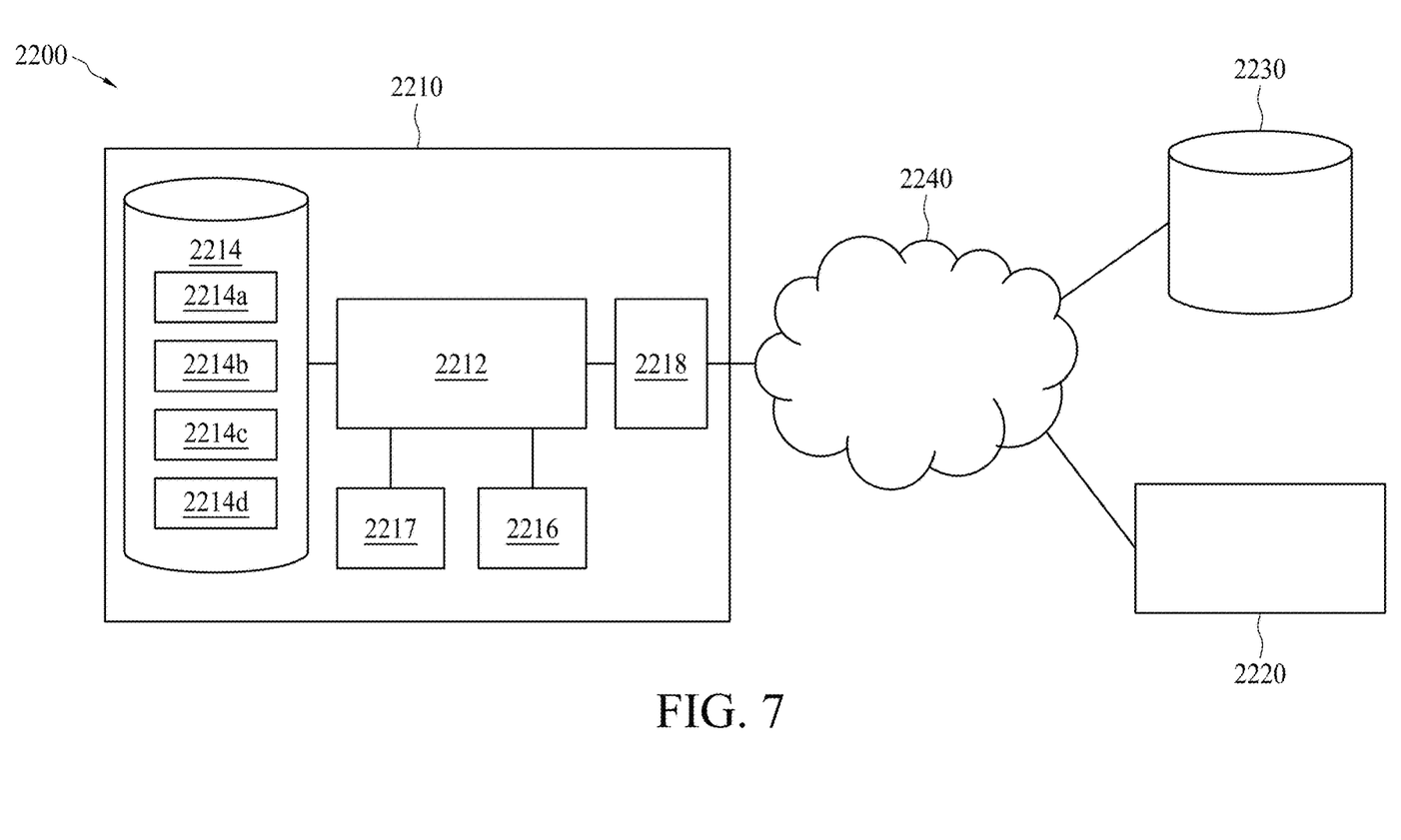
FIG. 7 is a functional block diagram of an integrated circuit design and modeling system in accordance with an embodiment.

FIG. 7 is a functional block diagram of an integrated circuit design and modeling system 2200 in accordance with an embodiment. Integrated circuit design and modeling system 2200 includes a first computer system 2210, a second computer system 2220, a networked storage device 2230, and a network 2240 connecting the first computer system 2210, the second computer system 2220, and the networked storage device 2230. In some embodiments, one or more of the second computer system 2220, the storage device 2230, and the network 2240 are omitted. In some embodiments, two or more of the first computer system 2210, second computer system 2220, and/or storage device 2230 are combined into a single computer system.

The first computer system 2210 includes a hardware processor 2212 communicatively coupled with a non-transitory, computer readable storage medium 2214 encoded with, i.e., storing, a generated integrated layout 2214*a*, a circuit design 2214*b*, a computer program code 2214*c*, i.e., a set of executable instructions, and a standard cell library 2214*d* having layout patterns as described herein. The processor 2212 is electrically and communicatively coupled with the computer readable storage medium 2214. The processor 2212 is configured to execute the set of instructions 2214*c* encoded in the computer readable storage medium 2214 in order to cause the computer 2210 to be usable as a placing and routing tool for generating a layout design based on the standard cell library 2214*d*. The processor 2212 is also configured to execute the set of instructions 2214*c* encoded in the computer readable storage medium 2214 in order to cause the computer 2210 to perform the operations 102-112 of the method 100.

In some embodiments, standard cell library 2214*d* is stored in a non-transitory storage medium other than storage medium 2214. In some embodiments, standard cell library 2214*d* is stored in a non-transitory storage medium in networked storage device 2230 or second computer system 2220. In such case, standard cell library 2214*d* is accessible by the processor 2212 through the network.

In some embodiments, the processor 2212 is a central processing unit (CPU), a multi-processor, a distributed processing system, an application specific integrated circuit (ASIC), and/or a suitable processing unit.

In some embodiments, the computer readable storage medium 2214 is an electronic, magnetic, optical, electromagnetic, infrared, and/or a semiconductor system (or apparatus or device). For example, the computer readable storage medium 2214 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 2214 includes a compact disk-read only memory (CD-ROM), a compact disk-read/write (CD-R/W), and/or a digital video disc (DVD).

The computer system 2210 includes, in at least some embodiments, an input/output interface 2216 and a display unit 2217. The input/output interface 2216 is coupled to the controller 2212 and allows the circuit designer to manipulate the first computer system 2210. In at least some embodiments, the display unit 2217 displays the status of executing the placing and routing tool 2214*a* in a real-time manner and provides a Graphical User Interface (GUI). In at least some embodiments, the input/output interface 2216 and the display 2217 allow an operator to operate the computer system 2210 in an interactive manner.

It is noted that the term "metal" mentioned in the above embodiments is merely an exemplary conductive material, and this is not a limitation of the present embodiments. The term "metal" may be any electrical conductive material.

According to some embodiments, a memory cell is provided. The memory cell comprises a first transistor, a second transistor, and a third transistor. The first transistor has a first diffusion region coupled to a bit line and a first gate electrode coupled to a first word line. The second transistor has a second diffusion region coupled to the bit line and a second gate electrode coupled to a second word line. The third transistor has a third diffusion region coupled to a fourth diffusion region of the first transistor, a fifth diffusion region coupled to a sixth diffusion region of the second transistor, and a third gate electrode coupled to a third word line. The first transistor is arranged to have a first threshold voltage, the second transistor is arranged to have a second threshold voltage, and the second threshold voltage is different from the first threshold voltage.

According to some embodiments, layout of a memory cell is provided. The layout of a memory cell comprises a semiconductor substrate, an active region, a first conductive line, a second conductive line, a third conductive line, and a specific computer aided design (CAD) layer. The active region is disposed on the semiconductor substrate. The first conductive line is disposed over a first portion of the active region to form a first transistor. The second conductive line is disposed over a second portion of the active region to form a second transistor. The third conductive line is disposed over a third portion of the active region to form a third transistor. The threshold voltage of the second transistor is different from the threshold voltage of the first transistor.

According to some embodiments, a method of forming a memory cell, is provided. The method comprises: providing a semiconductor substrate; forming a first transistor with a first threshold voltage on a first portion of an active region of the semiconductor substrate; forming a second transistor with a second threshold voltage on a second portion of the active region, wherein the second threshold voltage is different from the first threshold voltage; forming a third transistor on a third portion of the active region; coupling a first diffusion region of the first transistor and a first diffusion region of the second transistor to a bit line of the memory cell; and coupling a first gate electrode of the first transistor, a second gate electrode of the second transistor, and a third gate electrode of the third transistor to a first word line, a second word line, and a third word line of the memory cell respectively; wherein a second diffusion region of the first transistor is coupled to a first diffusion region of the third transistor, and a second diffusion region of the second transistor is coupled to a second diffusion region of the third transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A layout of a memory cell, comprising:
   a semiconductor substrate;
   an active region, disposed on the semiconductor substrate;
   a first conductive line, disposed over a first portion of the active region to form a first transistor coupled to a bit line of the memory cell;
   a second conductive line, disposed over a second portion of the active region to form a second transistor coupled to the bit line of the memory cell; and
   a third conductive line, disposed over a third portion of the active region to form a third transistor coupled to a first word line of the memory cell;
   wherein a threshold voltage of the second transistor is different from a threshold voltage of the first transistor, and
   wherein the first transistor and the second transistor are disposed on two sides of the third transistor, and the third transistor electrically couples the first transistor to the second transistor.

2. The layout of claim 1, wherein the first conductive line, the second conductive line, and the third conductive line are polysilicon lines.

3. The layout of claim 1, wherein the threshold voltage of the second transistor is lower than the threshold voltage of the first transistor.

4. The layout of claim 1, wherein the first transistor comprises a first gate dielectric layer with a first thickness, the second transistor comprises a second gate dielectric layer with a second thickness, and the second thickness is smaller than the first thickness.

5. The layout of claim 1, wherein the first transistor further comprises a first channel region with a first dopant concentration, the second transistor further comprises a second channel region with a second dopant concentration, and the second dopant concentration is greater than the first dopant concentration.

6. The layout of claim 1, further comprising:
   a first conductive via, coupled to a first side of the first portion of the active region;
   a fourth conductive line, coupled to the first conductive via and the bit line of the memory cell;
   a second conductive via, coupled to a first side of the second portion of the active region; and
   a fifth conductive line, coupled to the second conductive via and the bit line of the memory cell.

7. The layout of claim 6, wherein the fourth conductive line and the fifth conductive line are metal lines.

8. The layout of claim 6, further comprising:
   a third conductive via, coupled to the first conductive line;
   a sixth conductive line, coupled to the third conductive via and a second word line of the memory cell;
   a fourth conductive via, coupled to the third conductive line;
   a seventh conductive line, coupled to the fourth conductive via and the first word line of the memory cell;
   wherein the second conductive line is coupled to a third word line of the memory cell.

9. The layout of claim 8, wherein the sixth conductive line and the seventh conductive line are metal lines.

10. A layout of a memory cell, comprising:
    a semiconductor substrate;
    an active region, horizontally disposed on the semiconductor substrate;
    a first conductive line, vertically disposed over the semiconductor substrate via a first gate dielectric layer;
    a second conductive line, vertically disposed over the semiconductor substrate via a second gate dielectric layer;
    a third conductive line, vertically disposed over the semiconductor substrate via a third gate dielectric layer, wherein the third conductive line is arranged between the first conductive line and the second conductive line;
    a plurality of diffusion regions disposed in the active region and on both sides of the first conductive line, the second conductive line and the third conductive line;

a fourth conductive line, electrically coupled to one of the diffusion regions at one side of the first conductive line and a bit line of the memory cell; and a fifth conductive line, electrically coupled to one of the diffusion regions at one side of the second conductive line and the bit line of the memory cell, wherein the first transistor is arranged to have a first threshold voltage, the second transistor is arranged to have a second threshold voltage, and the first threshold voltage is different from the second threshold voltage.

11. The layout of claim 10, wherein the second threshold voltage is lower than the first threshold voltage.

12. The layout of claim 10, wherein the third transistor is arranged to have a third threshold voltage, and the third threshold voltage is equal to the first threshold voltage.

13. The layout of claim 10, wherein the first gate dielectric layer has a first thickness, the second gate dielectric layer has a second thickness, and the second thickness is smaller than the first thickness.

14. The layout of claim 10, wherein the first transistor further comprises a first channel region with a first dopant concentration, the second transistor further comprising a second channel region with a second dopant concentration, and the second dopant concentration is greater than the first dopant concentration.

15. The layout of claim 10, further comprising:
a first conductive via, electrically coupling the diffusion region at one side of the first conductive line to the fourth conductive line; and
a second conductive via, electrically coupling the diffusion region at one side of the second conductive line to the fifth conductive line.

16. The layout of claim 15, further comprising:
a third conductive via, electrically coupled to the first conductive line;
a sixth conductive line, electrically coupled to the third conductive via and a first word line of the memory cell;
a fourth conductive via, electrically coupled to the third conductive line;
a seventh conductive line, electrically coupled to the fourth conductive via and a second word line of the memory cell;
wherein the second conductive line is coupled to a third word line of the memory cell.

17. A layout of a memory cell, comprising:
a semiconductor substrate;
an active region, disposed on the semiconductor substrate;
a first conductive line, disposed over a first portion of the active region to form a first transistor, wherein a first side of the first portion of the active region is electrically connected to a bit line of the memory cell;
a second conductive line, disposed over a second portion of the active region to form a second transistor, wherein a first side of the second portion of the active region is electrically connected to the bit line of the memory cell; and
a third conductive line, disposed over a third portion of the active region to form a third transistor, wherein the third conductive line is electrically coupled to a word line of the memory cell, wherein a first resistor with a first resistance is formed between the word line and the bit line through the first portion, a second resistor with a second resistance is formed between the word line and the bit line through the second portion, and the second resistance is smaller than the first resistance.

18. The layout of claim 17, wherein a threshold voltage of the second transistor is lower than a threshold voltage of the first transistor.

19. The layout of claim 17, wherein the first transistor comprises a first gate dielectric layer with a first thickness, the second transistor comprises a second gate dielectric layer with a second thickness, and the second thickness is smaller than the first thickness.

20. The layout of claim 17, wherein the first transistor further comprises a first channel region with a first dopant concentration, the second transistor further comprising a second channel region with a second dopant concentration, and the second dopant concentration is greater than the first dopant concentration.

* * * * *